United States Patent [19]

De Ronde

[11] 4,264,881

[45] Apr. 28, 1981

[54] MICROWAVE DEVICE PROVIDED WITH A ½ LAMBDA RESONATOR

[75] Inventor: Frans C. De Ronde, Eindhoven, Netherlands

[73] Assignee: U.S. Philips Corporation, New York, N.Y.

[21] Appl. No.: 860,701

[22] Filed: Dec. 15, 1977

Related U.S. Application Data

[63] Continuation of Ser. No. 741,234, Nov. 12, 1976, abandoned, which is a continuation of Ser. No. 635,415, Nov. 26, 1975, abandoned, which is a continuation of Ser. No. 513,707, Oct. 10, 1974, abandoned.

[30] Foreign Application Priority Data

Oct. 17, 1973 [NL] Netherlands .......................... 7314269

[51] Int. Cl.³ ...................... H01P 1/203; H01P 1/213; H03B 7/14

[52] U.S. Cl. ............................ 333/110; 331/107 SL; 333/204; 333/222; 333/223; 333/246; 455/327

[58] Field of Search .................. 325/445, 446; 331/96, 331/101, 107 G, 107 SL; 333/73 S, 82 R, 82 B, 84 M, 17 L, 204, 222, 223, 246; 334/15, 41, 45; 455/325-327

[56] References Cited

U.S. PATENT DOCUMENTS

| | | | |
|---|---|---|---|
| 3,082,385 | 3/1963 | Grandqvist | 333/82 R |
| 3,153,209 | 10/1964 | Kaiser | 333/84 M X |
| 3,164,791 | 1/1965 | Dent | 33/84 M X |
| 3,317,860 | 5/1967 | Graver | 333/17 L |
| 3,517,348 | 6/1970 | Frost | 333/84 M X |

*Primary Examiner*—Paul L. Gensler
*Attorney, Agent, or Firm*—Algy Tamoshunas

[57] ABSTRACT

A microwave device is disclosed comprising a microstrip line pattern including an open ring forming a ½λ resonator having a narrow gap in which the electromagnetic field is closely tied to the ring.

4 Claims, 27 Drawing Figures

MICROWAVE DEVICE PROVIDED WITH A ½ LAMBDA RESONATOR

This application is a continuation of Application Ser. No. 741,234, filed Nov. 12, 1976, now abandoned; which in turn is a continuation of Application Ser. No. 635,415, filed Nov. 26, 1975, now abandoned; which in turn is a continuation of Application Ser. No. 513,707, filed Oct. 10, 1974, now abandoned.

The invention relates to a microwave device provided with a ½λ resonator which comprises a substrate, a conducting ground plane disposed on one major surface of the substrate and a line pattern arranged on the other major surface on the substrate.

Such a device designed in microstrip technique and provided with a ½λ resonator is described inter alia in I.E.E.E. Transactions on MTT, Vol. 20, No. 11, November 1972, pages 719–728. The line pattern of this device comprises a microstrip line in the form of a right-angled U which is generally referred to as hairpin resonator.

The value of the quality factor Q of the ½λ resonator is generally used as a measure of the suitability of such a device.

However, the hairpin resonator has a comparatively low quality factor Q, a large spatial spread of the electromagnetic field and when coupled to other components of the microstrip microwave device readily gives rise to surface waves. It is an object of the present invention to obviate these disadvantages of a device of the abovedescribed type by changing the conductor pattern, thereby realizing a device which is particularly suitable to be designed in microstrip technique.

The device according to the invention is characterized in that the conductor pattern includes an annular conductor which forms the ½λ resonator and which at one point is interrupted by a slot the width of which is small as compared with the circumference of the ring.

It should be mentioned that devices having closed ring resonators are known. In such prior art resonators, the rings have circumferences which correspond to the wavelength at the operating frequency. However, such a device is bulky and at resonance, if, for example, its configuration is not fully symmetrical it readily suffers from degeneracy of the resonator into two ½λ resonators having resonant frequencies which are slightly shifted with respect to one another. Due to a comparatively large electromagnetic-field spread of the resonator, such a device also exhibits unwanted coupling with other components.

Figure 1:
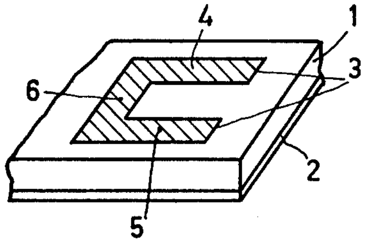
Figure 2:
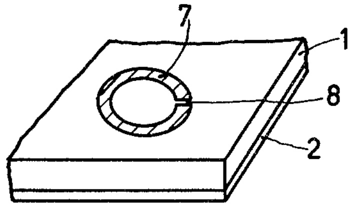

Embodiments of the invention will now be described, by way of example, with reference to the accompanying diagrammatic drawings, in which FIG. 1 shows part of a known microwave device, FIG. 2 shows part of a microwave device according to the invention, FIGS. 3*a* to 3*g* show possible forms of coupling between two resonators used in a microwave device according to the invention.

Figure 4A:
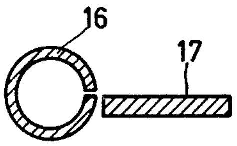
Figure 4B:
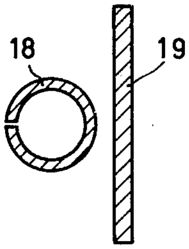
Figure 4C:
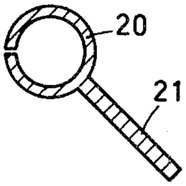
Figure 4D:
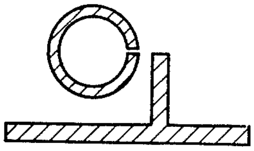
Figure 4E:
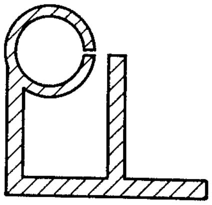
Figure 4F:
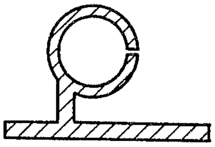
Figure 4G:
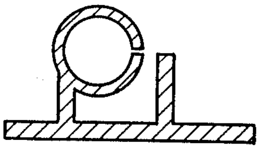
Figure 5A:
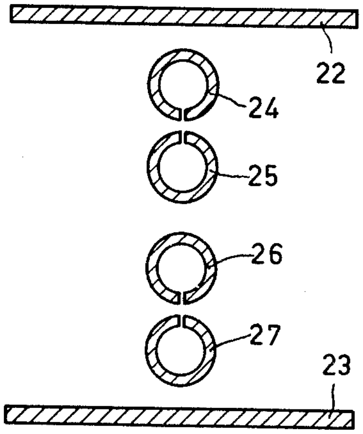
Figure 5B:
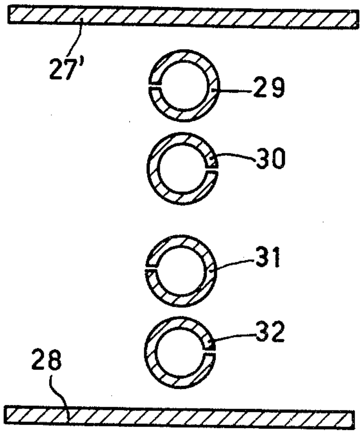
Figure 6A:
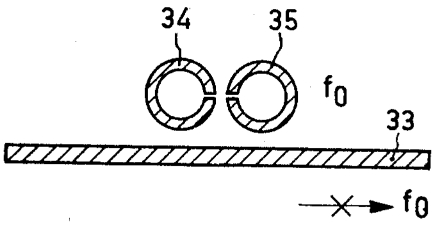
Figure 6B:
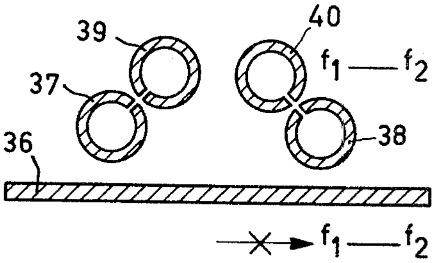
Figure 6C:
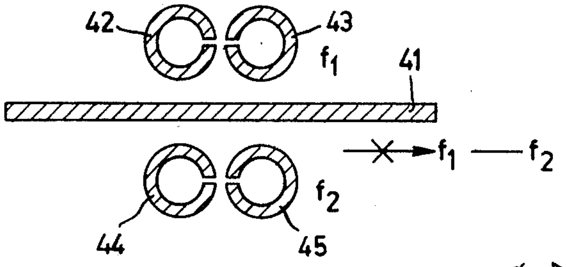
Figure 8:
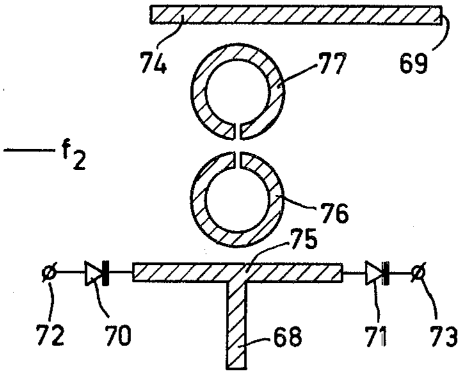
Figure 7A:
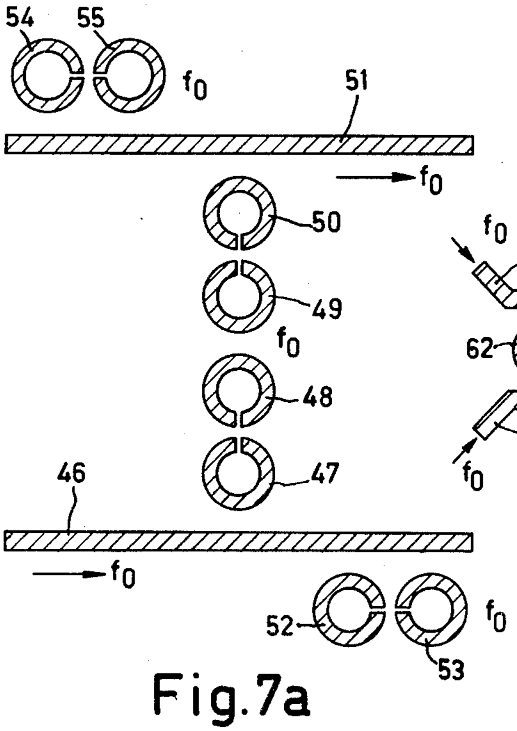
Figure 7B:
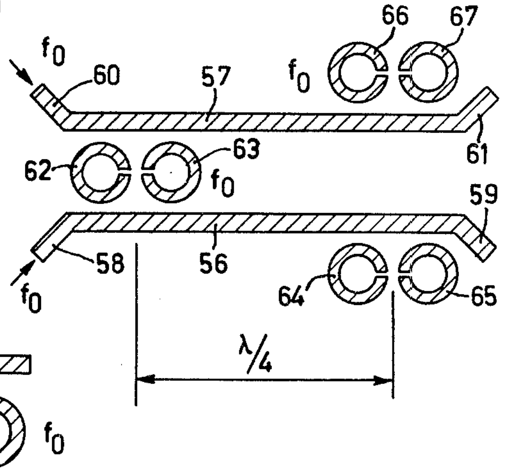
Figure 9:
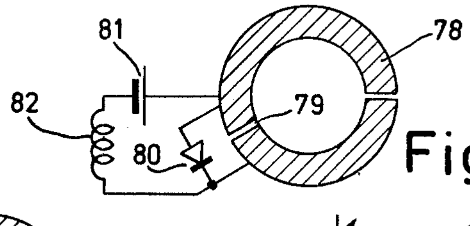
Figure 10A:
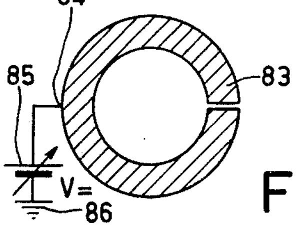
Figure 10B:
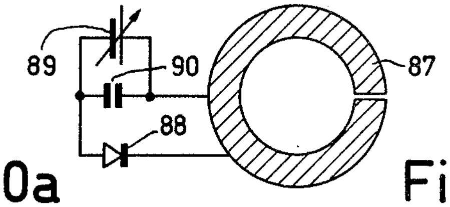

FIGS. 4*a* to 4*g* show possible forms of coupling between a resonator and a straight microstrip line in a device according to the invention, FIGS. 5*a*and 5*b* show devices according to the invention which have band-pass characteristics, FIGS. 6*a* to 6*c* show devices according to the invention which have band-rejection characteristics, FIGS. 7*a* and 7*b* show devices according to the invention which have directional band-pass characteristics, FIG. 8 shows a device according to the invention in which two signals can be mixed, FIG. 9 shows a device according to the invention which generates a high-frequency signal, and FIGS. 10*a* and 10*b* show devices according to the invention which include electrically tunable ½λ-resonators.

Referring now to FIG. 1, there is shown part of a known device which is designed in microstrip technique and includes a ½λ hairpin resonator. The device has a substrate 1 which is made, for example, of a dielectric material and which on one major surface is provided with a conductive ground plane 2 and on the other major surface with a line pattern 3. This line pattern 3 has the form of a right-angled U and constitute the ½λ resonator. This resonator is coupled with other components of the device which are designed in microstrip technique but are not shown in the figure. If such a resonator is excited in the odd mode, it is found that the closer the limbs of the resonator are to one another the more the currents in these limbs 4 and 5 tend to flow along their inner facing edges. The line pattern is obtained by means of etching or vapour deposition techniques. The edges of a line manufactured by such a technique are not sharply defined, so that the resistance of the line along its edges is higher than at its centre. The resulting additional losses due to the odd-mode currents constitute one of the causes of the comparatively low value of the quality factor of a hairpin resonator. Increasing the length of the cross piece 6 reduces this effect. On the other hand such an increase also increases the spacing between the open ends of the limbs 4 and 5 and consequently the field produced between them extends further into space. This gives rise to unwanted coupling to other components of the microstrip line device near the resonator. Moreover, because of the discontinuities at the open ends of the limbs 4 and 5 and the right-angle bends at the closed ends thereof, such resonators readily tend to excite surface waves which propagate in the microwave device.

The element of a microwave device according to the invention, as shown in FIG. 2 avoids these disadvantages in that it includes a microstrip line 7 in the form of a ring which at one point is interrupted by a slot 8 the width of which is small in comparison with the circumference of the ring. The ring forms a ½λ open resonator.

The quality factor Q of this ½λ open-ring resonator is higher than that of a hairpin resonator, because the electromagnetic field is tied more closely to the ring, the current distribution over the cross-section of the line is better and the line has less discontinuties than the hairpin resonator. In addition, for a ring the ratio between the surface area and the circumference is optimal so that the ratio L/R and hence the quality factor Q are optimal as well.

For example, the quality factor of a practical microstrip line hairpin resonator was about 150 and that of a ½λ open-ring resonator which operated at the same frequency and was disposed on the same substrate wave about 300.

The fact that the electromagnetic field is closely tied to the ring, makes devices provided with such resonators particularly suited for use in microstrip line designs because unwanted coupling with adjacent components is small. In other words microstrip line devices including such resonators require less surface area than devices which include known resonators.

For simplicity, in the following figures only part of the line pattern provided on a substrate is shown.

FIGS. 3*a* to 3*g* show desirable coupling possibilities between at least two ½λ open-ring resonators in a microwave device according to the invention.

Figure 3A:
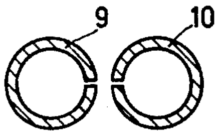
Figure 3B:
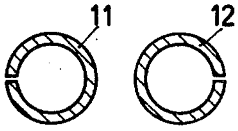
Figure 3C:
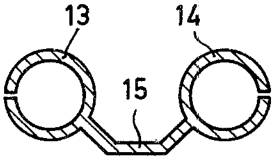
Figure 3D:
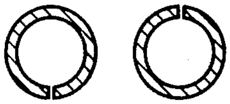
Figure 3E:
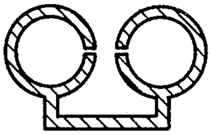
Figure 3F:
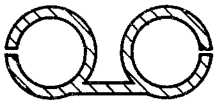
Figure 3G:
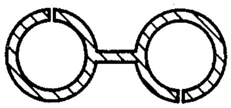

FIG. 3*a* shows a configuration which comprises two ½λ open-ring resonators 9 and 10 which are electrically coupled with one another. FIG. 3*b* shows a configuration in which two ½λ open-ring resonators 11 and 12 are magnetically coupled with each other, and FIG. 3*c* shows a direct coupling between two ½λ open-ring resonators 13 and 14 by means of a line 15. FIGS. 3*d* to 3*g* show combinations of such couplings. Thus FIG. 3*d* shows a configuration in which there is both electric coupling and magnetic coupling, FIG. 3*e* shows a configuration in which there is both electric and direct coupling and 3*f* shows a configuration in which there is both magnetic and direct coupling, while FIG. 3*g* shows a configuration in which there is electric, magnetic and direct coupling.

The magnetic coupling shown in FIG. 3*b* does not occur by itself in devices including hair pin resonators. Usually a combination of magnetic and electric coupling occurs in the form of what is generally referred to as proximity coupling between one limb of a first hairpin resonator and a parallel arranged limb of a second hairpin resonator.

However, in microstrip line devices the latter coupling can not be readily realized with optimum properties, because coupling occurs due to unequal phase velocities for the even-mode and odd-mode signals and surface waves are excited due to the open-ended configuration. In contrast therewith, a ½λ open-ring resonator permits optimum magnetic coupling without the aforementioned effects playing a part.

Direct coupling is used if a circuit having wide-band properties is to be realized since direct coupling is very strong, enabling the bandwidth to be increased with low losses.

In a micro-wave device, the ½λ open-ring resonator can also be coupled to microstrip lines. FIG. 4*a* shows electric coupling, FIG. 4*b* magnetic coupling and FIG. 4*c* direct coupling between a ½λ-open-ring resonator 16, 18, 20 and a microstrip line 17, 19, 21, respectively. Mixed electric and magnetic coupling is shown in FIG. 4*d*, mixed electric and direct coupling in FIG. 4*e*, mixed magnetic and direct coupling in FIG. 4*f*, and mixed electric, magnetic and direct coupling in FIG. 4*g*.

Micro-wave devices which include ½λ open-ring resonators and in which the couplings are used may have other characteristics such as a bandpass or band-rejection characteristic or a directional bandpass or directional band rejection characteristic.

FIGS. 5*a* and 5*b* show examples of micro-wave devices which include ½λ open-ring resonators and have bandpass characteristics. The operation of the devices is based on the fact that each pair of microstrip lines 22, 23 and 27, 28 is intercoupled only for signals having a frequency within the resonance curve of the ½λ open-ring resonators 24, 25, 26, 27 and 29, 30, 31, 32, respectively.

In FIG. 5*a* the straight micro-strip lines 22 and 23 are each coupled to the nearest resonator 24 and 27, respectively, by magnetic coupling, while the resonators 24, 25, 26 and 27 are coupled to one another either electrically or magnetically. In the microwave device shown in FIG. 5*b* all the couplings are combinations of electric and magnetic couplings. For signals having a frequency range of about 4% around 10 GHz these devices have a forward attenuation of a few dB and for signal frequencies lying outside this band, an isolation attenuation in excess of 70 dB.

FIGS. 6*a*, 6*b* and 6*c* show examples of microwave devices which include ½λ ring resonators and have band rejection character. The operation of each of these devices is based on interference. This means that the amplitude of the signal portion, which is coupled from the straight micro-strip lines 33, 36, 41 to the ½λ open-ring resonators 34, 35; 37, 38, 39, 40; 42, 43, 44, 45, respectively, and is coupled back from these resonators to the respective line, is equal to the amplitude of the signal portion which propagates through the straight micro-strip line 33; 36; 41 past the relevant resonator. Due to the couplings and the different path lengths, however, the phase difference between the signal portions is 180°, so that the signal is reflected at the positions of the resonators 34, 35; 37, 38, 39, 40; 42, 43, 44, 45, respectively.

The part of a microwave device shown in FIG. 6*a* produces an isolation attenuation in excess of 70 dB over a band of ½% at a band centre frequency of 10 GHz. Outside this band the forward attenuation was equal to that of the straight micro-strip line 33 alone. To increase the band-width, a plurality of pairs of overcritically intercoupled identical resonators 38, 38; 39, 40 may be used, as in the element of the microwave device shown in FIG. 6*b*, or a plurality of pairs of resonators 42, 43; 44, 45 having slightly shifted resonance frequencies may be used, as in the element of a micro-wave device shown in FIG. 6*c*.

By means of the elements shown in FIGS. 5 and 6 micro-wave devices having directional band-pass characteristics can be obtained. FIG. 7*a*, for example, shows a device which comprises a combination of a device 46 to 51 having a bandpass characteristic and a device 46, 52, 53; 51, 54, 55 having a band rejection characteristic. Hence, the device shown in FIG. 7*a* has a directional bandpass characteristic. The operation of such a combined device will be obvious from the above.

The micro-wave device shown in FIG. 7*b* comprises a pair of microstrip lines 56 and 57 having signal terminals 58, 59 and 60, 61, respectively, and pairs of ½λ open-ring resonators 62, 62; 64, 65; 66, 67. A signal applied to the signal terminal 58 may be regarded as composed of an even-mode signal and an odd-mode signal between the signal terminals 58 and 60. At a signal frequency equal to the resonant frequency of the resonators 62 to 67, the odd-mode signal is reflected by the resonators 62 and 63 in the manner described above. The even-mode signal, however, does not excite the resonators 62 and 63 and hence propagates via the lines 56 and 57. The resonators 64, 65 and 66, 67 reflect this even-mode signal in the above-described manner. If the distance between the resonator pair 62, 63 and the resonator pairs 64, 65 and 66, 67, respectively, is an odd multiple of ¼ of the wavelength associated with the resonant frequency of the responator, the even-mode signal and the odd-mode signal are subtracted from one another at the signal terminal 58 and are added to one another at the signal terminal 60. Thus, a signal applied to the signal terminal 58 is applied to the signal terminal 60 at a frequency equal to the resonant frequency of the resonators, and vice-versa. The same applies to signals at this frequency which are applied to the signal terminals 59 and 61. A signal at a frequency outside the band of the resonators 62 to 67, when applied to one of the signal terminals 58 to 61, propagates along the relevant line 56 or 57 to the other end, from which it is delivered.

Other micro-wave devices provided with $\frac{1}{2}\lambda$ open-ring resonators are shown in FIGS. 8, 9 and 10.

FIG. 8 shows a micro-wave device in which two signals can be mixed. In this device a signal applied to a signal terminal 68 is mixed with a local oscillator signal applied to a signal terminal 69 by means of diodes 70 and 71. The mixed signal can be derived from terminals 72 and 73. Due to the symmetrical structure of the line pattern, the micro-strip line 74 is coupled through resonators 76 and 77 to the through line only of a T-shaped micro-strip line 75. Also, due to this symmetrical structure, the signal applied to the signal terminal 68 always is decoupled from the line 74.

The microwave device shown in FIG. 9 comprises a $\frac{1}{2}\lambda$ open-ring resonator 78 which has a second slot 79 which is shunted by a negative-resistance element 80 (for example a Gunn diode). A voltage supply source supplies a supply voltage to the diode 80 via an inductor 82. The position of the slot 79 is selected so that the impedance of $\frac{1}{2}\lambda$ open-ring resonator 78 at the site of the slot 79 is in accordance with the impedance of the diode 80 so as to achieve optimum matching. The diode 80 compensates the losses which occur in the resonator 78. If these losses are partly compensated, the micro-wave device behaves as an active filter, while if the losses are fully compensated it behaves as a micro-wave oscillator.

FIGS. 10*a* and 10*b* show devices which include electrically tunable $\frac{1}{2}\lambda$ open-ring resonators.

The micro-wave device of FIG. 10*a* includes a $\frac{1}{2}\lambda$ open-ring resonator 83 having a substrate made of a semiconductor material such, for example, as gallium arsenide. At a node 84 of the standing-wave pattern produced in the $\frac{1}{2}\lambda$ open-ring resonator 83, the latter is connected via an adjustable direct-voltage source 85 to a conducting ground plane 86 arranged on the lower surface of the substrate. Due to the voltage set up between the open-ring resonator and the ground plane, a depletion layer is formed in the semiconductor layer. Variation of the direct voltage causes a variation in the positioning of the depletion layer, causing a capacitive variation which changes the resonant frequency of the $\frac{1}{2}\lambda$ open-ring resonator.

The micro-wave device shown in FIG. 10*b* includes a $\frac{1}{2}\lambda$ open-ring resonator 87. A varactor 88 is connected between a point of the open-ring resonator at which the node of the standing wave occurs and a point of suitable impedance. The direct voltage required for the varactor 88 is supplied by an adjustable-direct voltage source 89 connected in series with the varactor. In order to short-circuit the direct-voltage source 89 for high-frequency signals, a capacitor 90 is connected between its terminals. Variation of the voltage of the direct-voltage source 89 varies the capacitance of the varactor 88 and hence the resonant frequency of the $\frac{1}{2}\lambda$ open-ring resonator 87.

What is claimed is:

1. A microwave device comprising a dielectric substrate, a conducting ground plane disposed on one major surface of the substrate and a line pattern disposed on the other major surface of the substrate, said line pattern including a straight microstrip line and at least two open-rings each forming a $\frac{1}{2}\lambda$ resonator, said rings each having a gap and being coupled to one another and to said straight line.

2. A microwave device as claimed in claim 1, wherein each of the $\frac{1}{2}\lambda$ open-ring resonators is coupled to the microstrip line by a further $\frac{1}{2}\lambda$ open-ring resonator.

3. A microwave device as claimed in claim 1, further including a second microstrip line arranged parallel to said straight microstrip line and coupled to the two $\frac{1}{2}\lambda$ open-ring resonators, and two additional pairs of $\frac{1}{2}\lambda$ resonators arranged at a distance equal to an odd multiple of $\frac{1}{4}\lambda$ from the center of the two $\frac{1}{2}\lambda$ open-ring resonators measured in the same direction along the microstrip lines, the ring resonators of each additional pair being coupled to one another, while one pair is coupled to one microstrip line and the other pair is coupled to the other microstrip line, the additional pairs of resonators being situated at the side of the microstrip lines opposite to the side on which are situated the two $\frac{1}{2}\lambda$ open-ring resonators .

4. A microwave device comprising a dielectric substrate, a conducting ground plane disposed on one major surface of the substrate, and a line pattern disposed on the other major surface of the substrate, said line pattern including an open-ring forming a $\frac{1}{2}\lambda$ resonator and having two gaps, one of said gaps being shunted by a negative resistance element.

* * * * *